(12) United States Patent
Frank

(10) Patent No.: US 8,546,884 B2
(45) Date of Patent: Oct. 1, 2013

(54) HIGH VALUE RESISTORS IN GALLIUM ARSENIDE

(75) Inventor: Michael L. Frank, Los Gatos, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1566 days.

(21) Appl. No.: 10/283,971

(22) Filed: Oct. 29, 2002

(65) Prior Publication Data

US 2004/0080396 A1    Apr. 29, 2004

(51) Int. Cl.
*H01L 23/62*    (2006.01)

(52) U.S. Cl.
USPC ......................................... 257/358

(58) Field of Classification Search
USPC ................. 257/289, 358, 536, 537, 379, 164, 257/489, 541–543, 626, 150, 77, E21.004, 257/288
See application file for complete search history.

(56) References Cited

U.S. PATENT DOCUMENTS

| | | | | |
|---|---|---|---|---|
| 3,731,164 A | * | 5/1973 | Cheney | 257/378 |
| 4,662,060 A | * | 5/1987 | Aina et al. | 29/571 |
| 5,047,827 A | * | 9/1991 | Clark, Jr. et al. | 357/51 |
| 5,065,132 A | * | 11/1991 | Taddiken et al. | 338/334 |
| 5,268,650 A | * | 12/1993 | Schnabel | 330/300 |
| 6,245,628 B1 | * | 6/2001 | Fukui et al. | 438/385 |
| 6,906,350 B2 | * | 6/2005 | Sriram | 257/77 |
| 2003/0017683 A1 | * | 1/2003 | Emrick et al. | 438/478 |
| 2005/0017272 A1 | * | 1/2005 | Yamashita et al. | 257/288 |

FOREIGN PATENT DOCUMENTS

WO    WO-95/25349    9/1995

* cited by examiner

*Primary Examiner* — Anthony Ho

(57) ABSTRACT

A high value resistor of the present invention has an active layer deposited over a semi-insulating substrate. Channel etch regions are defined within the active layer. Gate metal is deposited over each channel etch region. Ohmic contact material is deposited at opposing ends of the active layer to define connection regions. A second metal is deposited over the connection regions to form input/output pads. This resistor pattern presents significant increase in resistance in a given area without any additional processing or process steps.

3 Claims, 4 Drawing Sheets

HIGH VALUE RESISTORS IN GALLIUM ARSENIDE

Resistors in gallium arsenide are traditionally fabricated in one of two ways. The first and most universal way is to use the same active layer utilized for transistors. FIG. 1 illustrates a cross-sectional view of a prior art GaAs Field Effect Transistor (FET). An active layer is deposited over a semi-insulating substrate.

FIG. 2 illustrates a prior art GaAs resistor. The I/O pads are positioned in a similar manner to the source and drain shown in FIG. 1. The active layer is simply patterned as a stripe and I/O pads are formed on each end. The advantage to this technique is that the resistor is native, requiring no extra processing. The disadvantage is that the conductivity is set by the requirements of the transistor. In practice, this means that both very high and very low value resistors are physically large. A further disadvantage is associated with the methods used to pattern the active layer boundary. The edge of the active layer is typically not well-defined, and thus quite variable. Thus, to make a precision resistor, one must make the area to perimeter ratio high. This leads again to large physical size.

The second prior art technique (not shown) requires the deposition of another layer of the required conductivity and to form that layer into the desired resistor. Thus, the low value resistors use a more conductive layer while high value resistors use a less conductive layer. The resulting resistors are physically small. However, this extra layer adds cost to manufacturing and may adversely effect yield.

There are at least three levels of metallization, e.g. gate metal, ohmic contact metal, and second metal, in a GaAs integrated circuit as shown in FIGS. 1-3. Ohmic contact metal is driven into the semiconductor to establish source and drain contacts. Gate metal is used to pattern the gate of the FET. In this position, the width of the metal line largely determines the frequency response of the FET. Consequently, the gate metal is patterned with the more precision than any layer in the GaAs IC. In conjunction with at least one passivation layer, these metals are sufficient to form FETs, resistors, capacitors, inductors, and interconnects. The second metal is for interconnects only and is much thicker than the gate metal. Lowering the resistance of the second metal increases the thickness that results in much worse line and space resolution, requiring more than twice the minimum line width and line-to-line spacing.

SUMMARY

A novel high value resistor has an enhancement mode active layer deposited over a semi-insulating substrate. At least one channel etch region is defined within the active layer. Gate metal is deposited over each channel etch region. Ohmic contact material is deposited at opposing ends of the active layer to define connection regions. A second metal is deposited over the connection regions to form input/output pads.

DETAILS OF THE INVENTION

Figure 1:
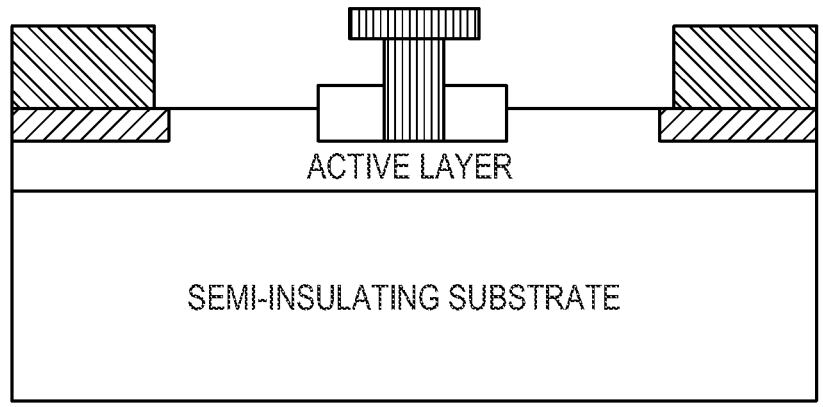
FIG. 1 illustrates a prior art GaAs field effect transistor.
Figure 2:
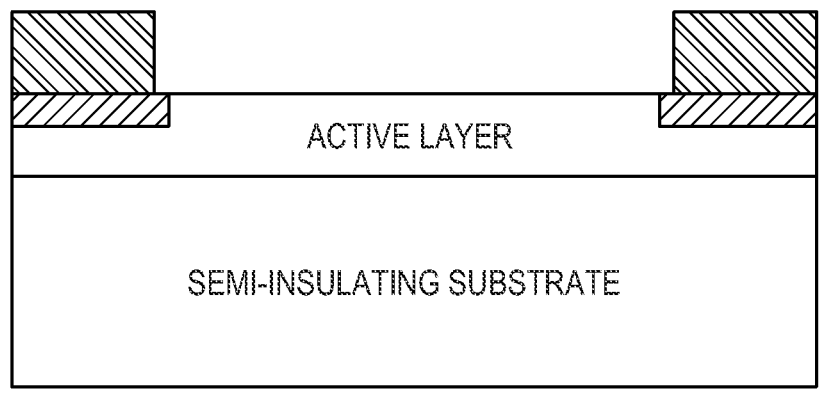
FIG. 2 illustrates a plan view of a prior art GaAs resistor.
Figure 3:
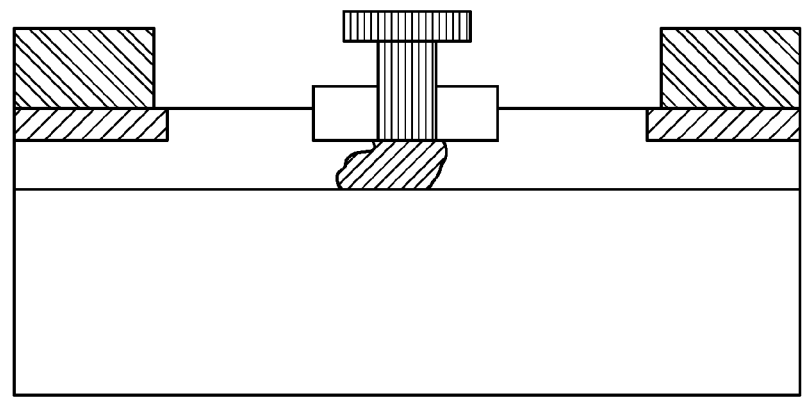
FIG. 3 illustrates a space charge region for a GaAs FET.

When metal is patterned onto a semiconductor, a space charge region is formed. In a GaAs FET, this space charge region reduces the conductivity of the channel. In a depletion mode transistor, this space charge region only slightly reduces the channel conductivity. To fully deplete the channel, the gate voltage must be negative with respect to the source. In an enhancement mode GaAs FET, this space charge region actually pinches off the channel completely. When a FET is patterned in this manner, an enhancement mode device is built. A gate voltage positive with respect to the source voltage is required to enable current flow and thus turn on the device (as shown in FIG. 3). An enhancement mode device eliminates the negative voltage requirement and can produce a high value resistor.

A resistor value (R) is the ratio of length (L) to width (W), multiplied by the sheet resistivity ($\rho$). Thus $R=(L/W)*\rho$. The resistor value (R) can be increased by either increasing L or $\rho$ or decreasing W. $\rho$ is set by the material and so is defined by the requirements of the transistor. The material forming the resistor can be thinned, e.g. utilizing an already existing etching step, resulting in perhaps a 2× increase in resistance. W is typically already minimized and so in practice forming a high value resistor required a large increase in L.

Figure 4:
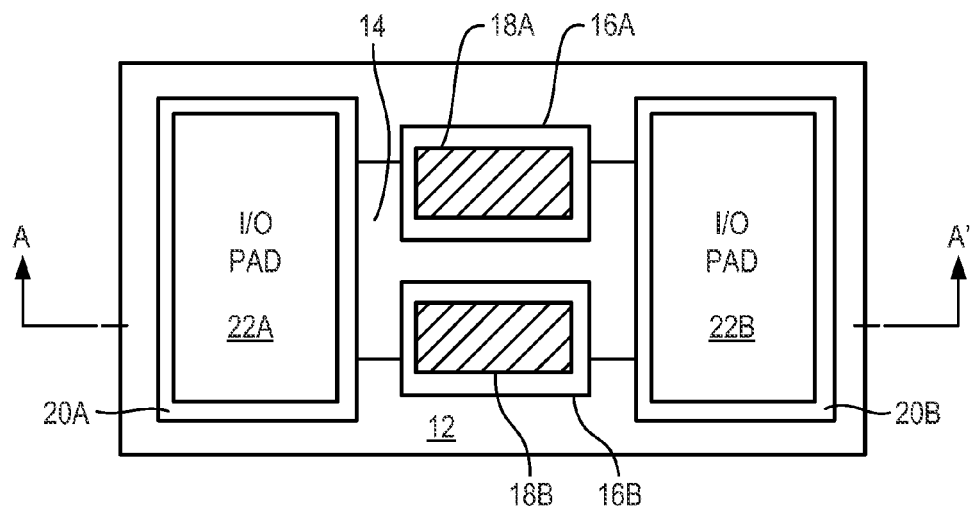
FIG. 4 illustrates a plan view of the resistor of the present invention.
Figure 5:
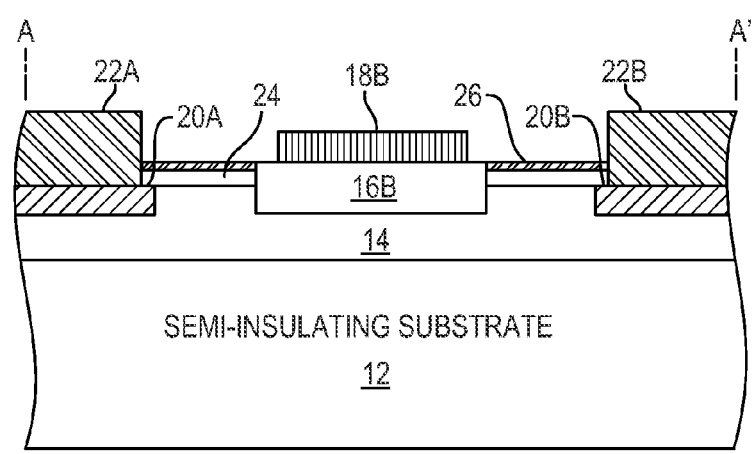
FIG. 5 illustrates a cross-sectional view of the resistor shown in FIG. 4 along line A-A'.

FIGS. 4 and 5 depict a resistor 10 of the present invention. FIG. 4 illustrates a plan view while FIG. 5 illustrates a cross-sectional view along line A-A'. An active layer 14 is deposited over a semi-insulating substrate 12. Channel etch regions 16A, 16B are defined within the active layer 14. Within the channel etch region, a layer of nitride passivation and the high conductivity encapsulation layer are removed. Gate metal 18A, 18B is deposited over each channel etch region 16A, 16B. Ohmic contact material 20A, 20B is deposited at opposing ends of the active layer 14 to define connection regions. Gate metal and perhaps the second metal 22A, 22B is deposited over the connection regions to form input/output pads.

The active layer has numerous functions. It must support a very high mobility channel, the path within which electron flow is preferred. This channel often requires a crystal with a significantly different lattice constant than the underlying substrate. Thus, the active layer often includes a super lattice structure that provides a lattice constant gradient from the substrate to the channel. This channel must be a specific depth from the surface. This specific thickness is then grown above the channel. To ensure that this thickness is achieved, an etch stop material is deposited on top of this layer. The etch stop material etches at a greatly reduced rate from that which is above. Thus, the gate itself is deposited on what is left of the etch stop layer. As it can be difficult to anneal a metal connection to this material, a top encapsulation layer is grown that can be electrically connected to. The top encapsulation layer is removed from the area that will have the gate deposited upon it.

The novel resistor may be grown as follows. An active layer, having the properties described above, can be deposited in any of multiple manners, e.g. ion implantation, vapor phase epitaxy, or molecular beam epitaxy (MBE) over the semi-insulating substrate, e.g. GaAs. A channel etch occurs to position a gate. Gate metal is deposited over the gate region of the channel etch. After activation anneal, ohmic contact material is deposited and sintered on both sides of the channel etch to form source and drain regions. The ohmic contacts must be very low resistance and have a high stability. The contacts may be gold, aluminum, silver, or alloys thereof.

All the transistors and the bulk resistors are composed of this buffer layer and whatever connections are required. Next, a dielectric encapsulation layer is deposited.

When patterned inside the channel etch region as shown, the gate metal forms a space charge region, forming a high resistance area just underneath. This high resistance is in parallel with the lower resistance of the remainder of the resistor pattern, and does not contribute significantly to the resistance value. Since the metal is also used for the gate, the patterning can be quite small, and the resulting gap, and thus the resistor width, can be as little as ⅓ of the minimum resistor width utilizing the prior art. Without any extra processing, the resistor is now 3 times the value as before.

Figure 6:
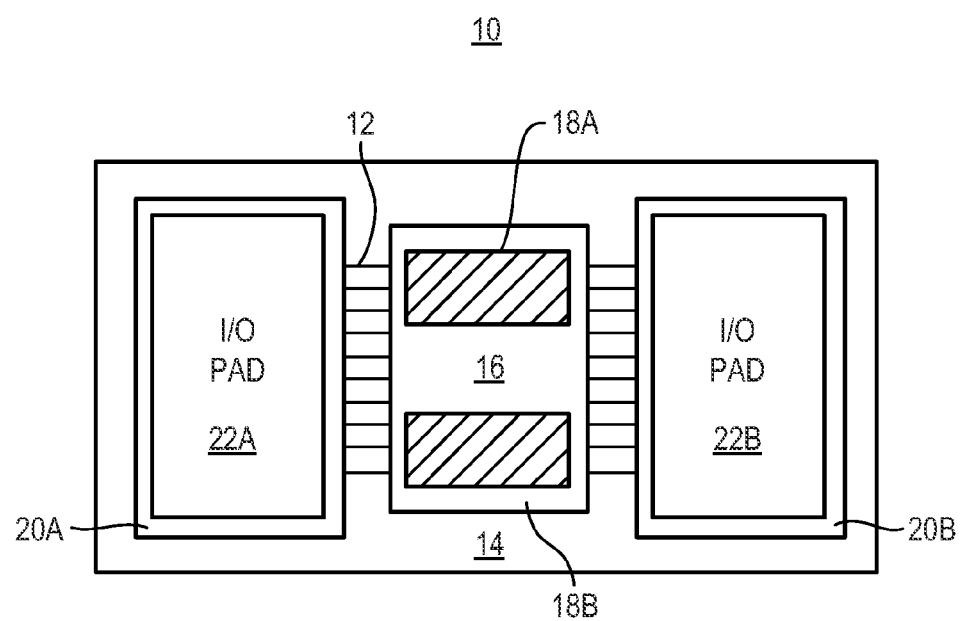
FIG. 6 illustrates another embodiment of the resistor of the present invention.

It is possible to increase the resistor value further by patterning the etch channel over more of the resistor area. This step removes the dielectric encapsulation layer in the material, and thus doubles the resistance. This is shown in FIG. 6.

Figure 7:
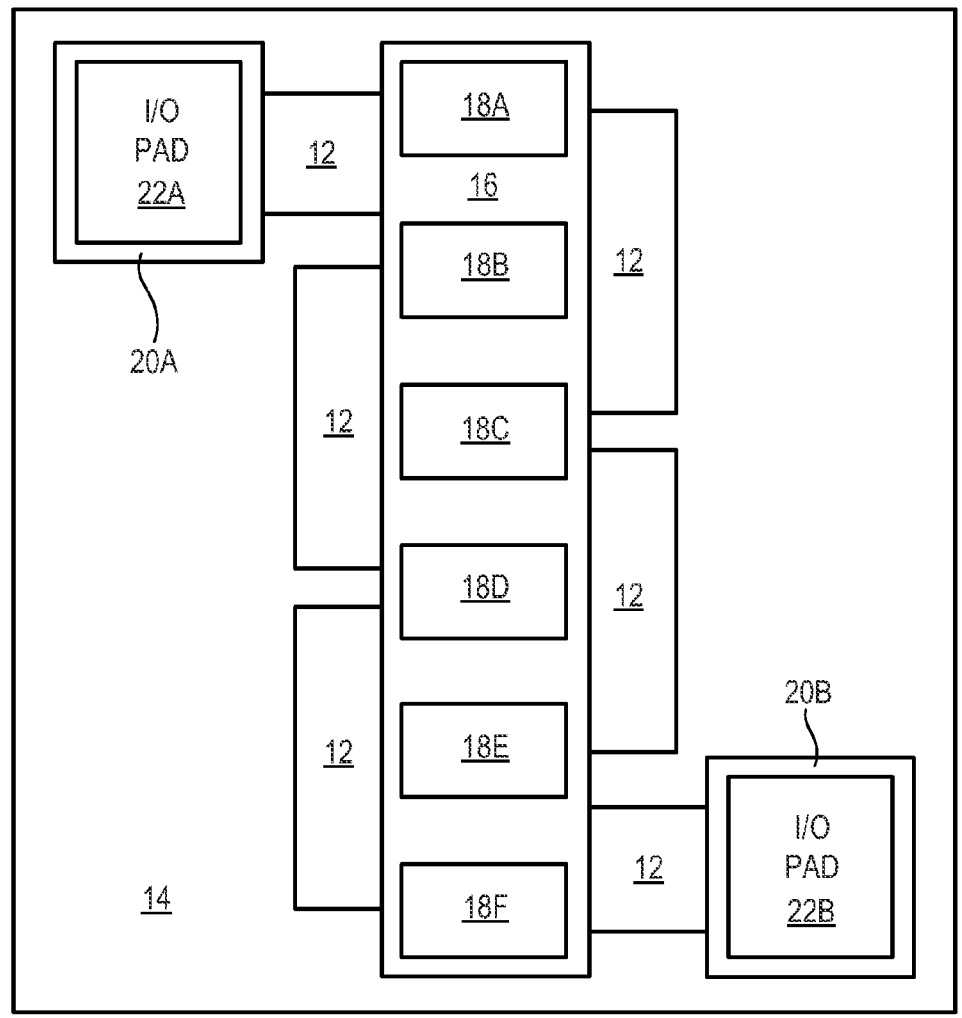
FIG. 7 illustrates another embodiment of the resistor of the present invention.

One can now build more complex resistor patterns that further increase the resistance in a particular area. One possibility is to use the gate metal to form a meander resistor. This is shown in FIG. 7. The current is forced to meander around the high resistivity portions defined by the gate metal, resulting in a very longer resistor. There are innumerable patterns available, all taking advantage of this technique.

I claim:

1. A device comprising:
   a resistor including:
   a semi-insulating substrate;
   an active layer, positioned over the semi-insulating substrate, including an epitaxial layer designed for enhancement mode operation;
   a first channel region positioned over the active layer;
   a first gate metal covering a portion of the first channel region;
   ohmic contact material positioned at opposing ends of the active layer;
   a second gate metal covering a portion of the first channel region; and
   metal positioned over the opposing ends of the active layer to form input/output pads.

2. A device comprising:
   a resistor including:
   a semi-insulating substrate;
   an active layer, positioned over the semi-insulating substrate, including an epitaxial layer designed for enhancement mode operation;
   a first channel region positioned over the active layer;
   a first gate metal covering a portion of the first channel region;
   ohmic contact material positioned at opposing ends of the active layer;
   a second channel region covering a portion of the active layer;
   a second gate metal covering a portion of the second channel region; and
   metal positioned over the opposing ends of the active layer to form input/output pads.

3. A device comprising:
   a resistor including:
   a semi-insulating substrate;
   an active layer, positioned over the semi-insulating substrate, including an epitaxial layer designed for enhancement mode operation;
   a first channel region having a serpentine shape, positioned over the active layer;
   a first gate metal covering a portion of the first channel region;
   ohmic contact material positioned at opposing ends of the active layer;
   a second gate metal covering a portion of the first channel region; and
   metal positioned over the opposing ends of the active layer to form input/output pads.

* * * * *